(12) United States Patent
Mateman et al.

(10) Patent No.: US 8,451,149 B2
(45) Date of Patent: May 28, 2013

(54) RF DIVIDER USING DIRECT DIGITAL SYNTHESIS

(75) Inventors: Paul Mateman, Millingen aan de Rijn (NL); Leonardus Hesen, Hegelsom (NL); Johannes Frambach, Nijmegen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 155 days.

(21) Appl. No.: 13/033,060

(22) Filed: Feb. 23, 2011

(65) Prior Publication Data
US 2012/0076231 A1     Mar. 29, 2012

Related U.S. Application Data

(60) Provisional application No. 61/386,790, filed on Sep. 27, 2010.

(51) Int. Cl.
*H03M 9/00*     (2006.01)

(52) U.S. Cl.
USPC ............................................ 341/101; 375/267

(58) Field of Classification Search
CPC ....................................................... H03M 9/00
USPC ........................... 341/100, 101; 375/260, 267
See application file for complete search history.

(56) References Cited

U.S. PATENT DOCUMENTS

| | | | |
|---|---|---|---|
| 7,388,939 B2 | 6/2008 | Dubash et al. | |
| 7,392,334 B2 | 6/2008 | Padaparambil | |
| 7,558,361 B2 | 7/2009 | Leenaerts et al. | |
| 2005/0276310 A1* | 12/2005 | Choi et al. | 375/130 |
| 2007/0058767 A1 | 3/2007 | Cao | |
| 2007/0263743 A1* | 11/2007 | Lee et al. | 375/267 |
| 2008/0165671 A1* | 7/2008 | Larsson | 370/204 |
| 2009/0259781 A1 | 10/2009 | Padaparambil | |
| 2010/0098177 A1* | 4/2010 | Hamaguchi et al. | 375/260 |

FOREIGN PATENT DOCUMENTS

| | | |
|---|---|---|
| CN | 101188600 B | 6/2010 |
| DE | 3917432 A1 | 12/1990 |
| EP | 1000462 B1 | 12/2002 |

OTHER PUBLICATIONS

Sveikata, J. and Morkvenas, R., "Research of Features of Synthesier for High Speed Communication Systems", Electronics and Electrical Engineering, ISSN 1392-1215, pp. 71-76, 2006, Nr. 3(67).
Patent Cooperation Treaty, International Search Report and Written Opinion, May 30, 2012.

* cited by examiner

*Primary Examiner* — Brian Young
(74) *Attorney, Agent, or Firm* — Coats & Bennett, P.L.L.C.

(57) ABSTRACT

An RF divider directly synthesizes a desired RF as a digital pattern that can be programmed and output at a VCO frequency. An exemplary RF divider comprises a pre-sequencer and a parallel-to-serial converter. The pre-sequencer successively outputs consecutive M-bit sections of a parallel word, where the parallel word comprises one or more copies of a frequency dividing bit pattern defining a frequency divisor. The parallel-to-serial converter performs a parallel-to-serial conversion on the M-bit sections of the parallel word based on the fixed radio frequency to generate an output signal having the desired radio frequency, where the output signal comprises a serial bit stream of the parallel word.

20 Claims, 10 Drawing Sheets

RF DIVIDER USING DIRECT DIGITAL SYNTHESIS

This application claims priority to Provisional U.S. Patent Application 61/386,790 filed 27 Sep. 2010, which is incorporated herein by reference.

The invention described herein relates generally to frequency dividers, and more particularly to digital frequency dividers having a non-integer divisor.

BACKGROUND

Radio frequency (RF) dividers are used in many communication systems to divide a fixed voltage controlled oscillator (VCO) frequency to a desired frequency. To meet phase noise requirements, however, conventional RF dividers typically require a lot of current, which undesirably increases the power consumption of the device. Further, conventional RF dividers typically only divide by a fixed integer number, which undesirably limits the frequencies available to the communication system.

SUMMARY

The present invention provides an RF divider that avoids many of the problems associated with conventional RF dividers by synthesizing the desired RF directly as a frequency dividing bit pattern that can be programmed and output at a fixed frequency, e.g., the frequency provided by a voltage-controlled oscillator (VCO), to generate a serial bit stream having the desired radio frequency. Because the desired RF signal is generated using direct digital synthesis, many of the phase noise problems associated with conventional RF dividers are avoided and/or may be addressed using low power digital post-processing techniques. Thus, the RF divider described herein may be configured to satisfy phase noise requirements without unduly increasing the power consumption. Further, because each bit in the output serial bit stream corresponds to some portion, e.g., half, of a VCO cycle, the synthesized pattern can realize integer dividers as well as non-integer dividers.

More particularly, the RF divider described herein digitally divides a fixed radio frequency, e.g., as provided by a VCO, by a frequency divisor defined by the frequency dividing bit pattern to provide a desired radio frequency. To that end, an exemplary RF divider comprises a pre-sequencer and a parallel-to-serial converter. The pre-sequencer successively outputs consecutive M-bit sections of a parallel word, where the parallel word comprises one or more copies of the frequency dividing bit pattern. The parallel-to-serial converter completes the digital synthesis of the desired radio frequency by performing a parallel-to-serial conversion on the M-bit sections of the parallel word based on the fixed radio frequency to generate an output signal having the desired radio frequency, where the output signal comprises a serial bit stream having a bit pattern defined by the parallel word. Embodiments disclosed herein include exemplary method and apparatus embodiments.

DETAILED DESCRIPTION

Figure 1:
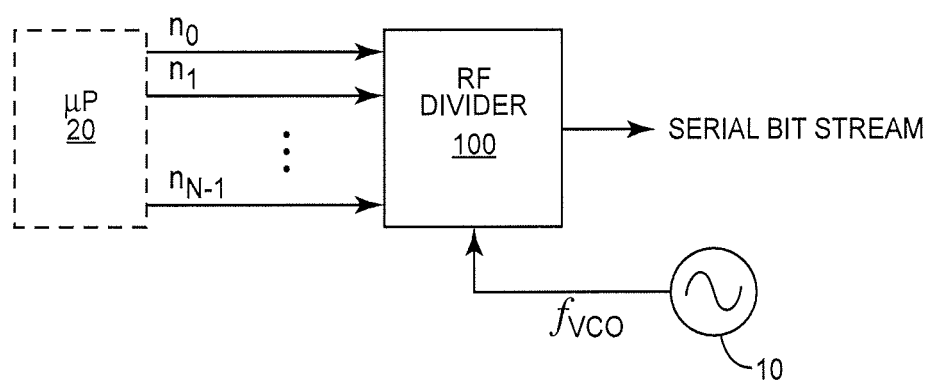
FIG. 1 depicts a general block diagram of an exemplary RF divider.

FIG. 1 shows an exemplary RF divider 100 that outputs a serial bit stream having a desired radio frequency based on a fixed radio frequency $f_{vco}$ provided by oscillator 10 and an N-bit parallel word, e.g., provided by processor 20. Processor 20 outputs the N-bit parallel word, which comprises one or more copies of a frequency dividing bit pattern, where the frequency dividing bit pattern defines the frequency divisor used to divide the fixed radio frequency $f_{vco}$ to achieve the desired radio frequency, as discussed in further detail herein. It will be appreciated that processor 20 may be programmed to output any parallel word suitable for achieving the desired frequency divisor. The processor 20 is not required, however, as the desired parallel word may be hard wired to the input of the RF divider 100, or provided by a static machine or other circuit.

Figure 2:
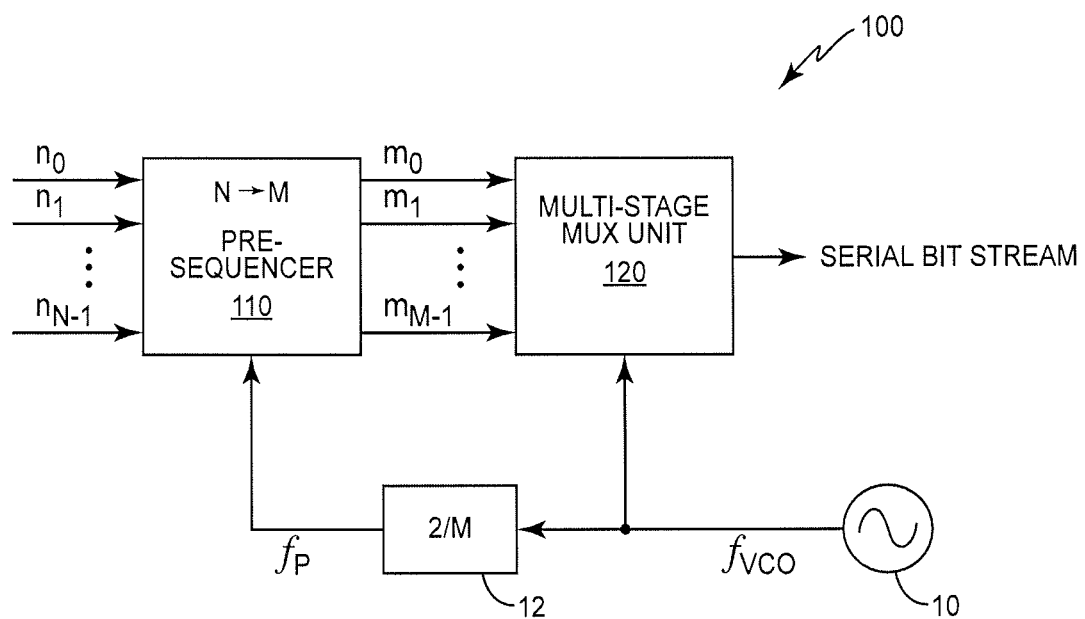
FIG. 2 depicts a more detailed block diagram of an exemplary RF divider.
Figure 3:
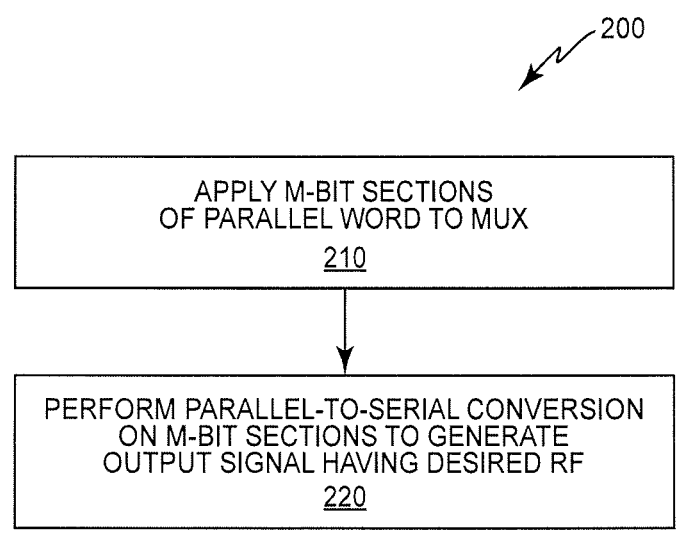
FIG. 3 depicts an exemplary method implemented by the RF divider of FIG. 1.

While it is possible to directly serialize the parallel word at $f_{vco}$ to generate the desired frequency, such operations are impractical at RF. To overcome this problem, RF divider 100 includes a pre-sequencer 110 and a multi-stage multiplexer 120, as shown in FIG. 2, that synthesize the desired radio frequency according to the exemplary method 200 of FIG. 3. Pre-sequencer 110 successively applies consecutive M-bit sections of the N-bit parallel word to an input of the multiplexer 120 (block 210), where M≦N. The pre-sequencer 110 is clocked using a pre-sequencer frequency $f_p$ derived in divider 12 based on $f_{vco}$ and M to apply a new M-bit section to the multiplexer 120 every $M/(2f_{vco})$ clock cycles. As a result, pre-sequencer 110 is able to operate at a reduced frequency, and therefore, a reduced complexity. Multiplexer 120 operates as a serializer that performs a parallel-to-serial conversion on each M-bit section to generate an output signal having the desired radio frequency (block 220), where the output signal comprises a serial bit stream of the parallel word, and where at least one bit is output every $1/f_{vco}$ clock cycles. While the RF divider 100 disclosed herein provides a 1-bit output for each clock cycle, it will be appreciated that any width could be used to generate the desired output signal. It will further be appreciated that each output bit is available for some predetermined portion of the VCO cycle, e.g., half of $f_{vco}$. Thus, the oscillator frequency effectively defines the least significant bit of the RF divider 100. The following describes exemplary details of the N-bit parallel word, pre-sequencer 110, and multi-stage multiplexer 120 according to various embodiments.

The parallel word input to the RF divider 100 includes one or more copies of a frequency dividing bit pattern comprising P bits, where the frequency divisor of the RF divider 100 is derived based on the frequency dividing bit pattern. The frequency dividing bit pattern is a sequence of P bits that, when output at the VCO frequency, divides the VCO frequency by P/2 to achieve the desired radio frequency. In some embodiments P=N, while in other embodiments N is an integer multiple of P. While the frequency dividing bit pattern (FDBP) may be repeated any number of times in the N-bit parallel word, the frequency dividing bit pattern is generally repeated an even number of times in the N-bit parallel word when P is odd. Table 1 shows several exemplary (and non-limiting) parallel words along with the corresponding patterns, values for P, minimum N, and frequency divisor. Inverted and/or rotated patterns generate the same output frequency, but with a different phase relation to the VCO phase.

TABLE 1

| Parallel Word | FDBP | P | Min N | Divisor |
|---|---|---|---|---|
| 001 001 | 001 | 3 | 6 | 1.5 |
| 0011 | 0011 | 4 | 4 | 2.0 |
| 00011 00011 | 00011 | 5 | 10 | 2.5 |
| 000111 | 000111 | 6 | 6 | 3.0 |
| 0000111 0000111 | 0000111 | 7 | 14 | 3.5 |
| 00001111 | 00001111 | 8 | 8 | 4.0 |
| 01 01 | 01 | 2 | 2 | 1.0 |

Pre-sequencer 110 generates M-bit parallel sections using M≦N consecutive bits from the N-bit parallel word. In general, pre-sequencer 110 generates the M-bit sections by concatenating M consecutive bits of the N-bit word. When M<N, the pre-sequencer 110 wraps the concatenated bits from one end of the N-bit word to the beginning of the N-bit to form a group of multiple M-bit sections, where the N-bit word repeats one or more times within the group. For example, pre-sequencer 110 takes the first M bits of the N-bit parallel word for the first M-bit section. The next M-bit section comprises the remaining N−M bits concatenated with the first M−(N−M) bits of the N-bit parallel word. This repeats some number of times to generate a group of x M-bit sections, where the N-bit word repeats y times in the group, where x=N/z, y=M/z, and z is the greatest common denominator of N and M.

The pre-sequencer 110 is clocked at a pre-sequencing frequency $f_p = 2f_{vco}/M$ to sequentially output each M-bit section to multiplexer 120 every $1/f_p$ cycles. By using a lower frequency to clock the pre-sequencer 110 instead of the higher $f_{vco}$, the RF divider 100 described herein operates with reduced complexity, power consumption, cost, criticality of layout, component quality, etc. The pre-sequencer 110 sequentially outputs each M-bit section in the group, and follows the last M-bit section in the group with the first M-bit section in the same group to provide the multi-stage multiplexer 120 with the M-bit sections to enable multiplexer 120 to output the serial bit stream without interruption.

The following provides some exemplary M-bit sections output by pre-sequencer 110 and examples of corresponding frequency dividing bit patterns. Each pre-sequencing operation executed by the pre-sequencer 110 converts the N-bit word to an M-bit section having a width that matches the input-width of the multi-stage multiplexer 120. The following examples assume the multi-stage multiplexer 120 has an input width of 8 bits. It will be appreciated, however, that the present invention is not so limited.

In one exemplary embodiment, pre-sequencer 110 comprises an 8-to-8 pre-sequencer that provides divisors of 2 and 4. Because this pattern may be implemented as an 8-bit word, it will be appreciated that while pre-sequencer hardware may be used, it is not required for this embodiment. Table 2 shows the M=8 bit section used for the 8-to-8 pre-sequencer.

TABLE 2

| Group of 8-bit Sections for 8-to-8 Pre-sequencing |
|---|
| Section 0 |
| p0 |
| p1 |
| p2 |
| p3 |
| p4 |
| p5 |
| p6 |
| p7 |

When the N-bit word is 0011 0011, the divisor is 2 because the frequency dividing bit pattern 0011 has P=4 bits. When the N-bit word is 0000 1111, the divisor is 4 because the frequency dividing bit pattern has P=8 bits.

In another exemplary embodiment, pre-sequencer 110 comprises a 12-to-8 pre-sequencer that provides divisors of 1.5, 3, and 6. In order to convert the N=12 bit word to an M=8 bit section, the N-bit word is repeated y=2 times within the group, and the group contains x=3 M-bit sections, as shown in Table 3.

TABLE 3

| Group of 8-bit Sections for 12-to-8 Pre-sequencing | | |
|---|---|---|
| Section 0 | Section 1 | Section 2 |
| p0 | p8 | p4 |
| p1 | p9 | p5 |
| p2 | p10 | p6 |
| p3 | p11 | p7 |
| p4 | p0 | p8 |
| p5 | p1 | p9 |
| p6 | p2 | p10 |
| p7 | p3 | p11 |

When the N-bit word is 001 001 001 001, the divisor is 1.5 because the frequency dividing bit pattern 001 has P=3 bits. When the N-bit word is 000111 000111, the divisor is 3 because the frequency dividing bit pattern 000111 has P=6 bits. When the N-bit word is 000000111111, the divisor is 6 because the frequency dividing bit pattern 000000111111 has P=12 bits.

In another exemplary embodiment, pre-sequencer 110 comprises a 10-to-8 pre-sequencer 110 that provides divisors of 2.5 and 5. In order to convert the N=10 bit word to an M=8 bit section, the N-bit word is repeated y=4 times within the group, and the group contains x=5 M-bit sections, as shown in Table 4.

TABLE 4

| Group of 8-bit Sections for 10-to-8 Pre-sequencing | | | | |
|---|---|---|---|---|
| Word 0 | Word 1 | Word 2 | Word 3 | Word 4 |
| p0 | p8 | p6 | p4 | p2 |
| p1 | p9 | p7 | p5 | p3 |
| p2 | p0 | p8 | p6 | p4 |
| p3 | p1 | p9 | p7 | p5 |
| p4 | p2 | p0 | p8 | p6 |
| p5 | p3 | p1 | p9 | p7 |
| p6 | p4 | p2 | p0 | p8 |
| p7 | p5 | p3 | p1 | p9 |

When the pattern is 00111 00111, the divisor is 2.5 because the frequency dividing bit pattern 00111 has P=5 bits. When the pattern is 0000011111, the divisor is 5 because the frequency dividing bit pattern 0000011111 has P=10 bits.

Multi-stage multiplexer 120 serializes the M-bit sections to generate the output bit signal having the desired frequency. The multiple stages of the multiplexer 120 enable the serialization of the M-bit sections while using a frequency less than $f_{vco}$ for most, if not all, stages. By using the appropriate frequency dividing bit pattern and by appropriately interconnecting the pre-sequencer 110 and multiplexer 120, the serial bit stream output by the RF divider 100 comprises a serial bit stream that repeats the frequency dividing bit pattern to generate an output signal having the desired radio frequency.

Figure 4:
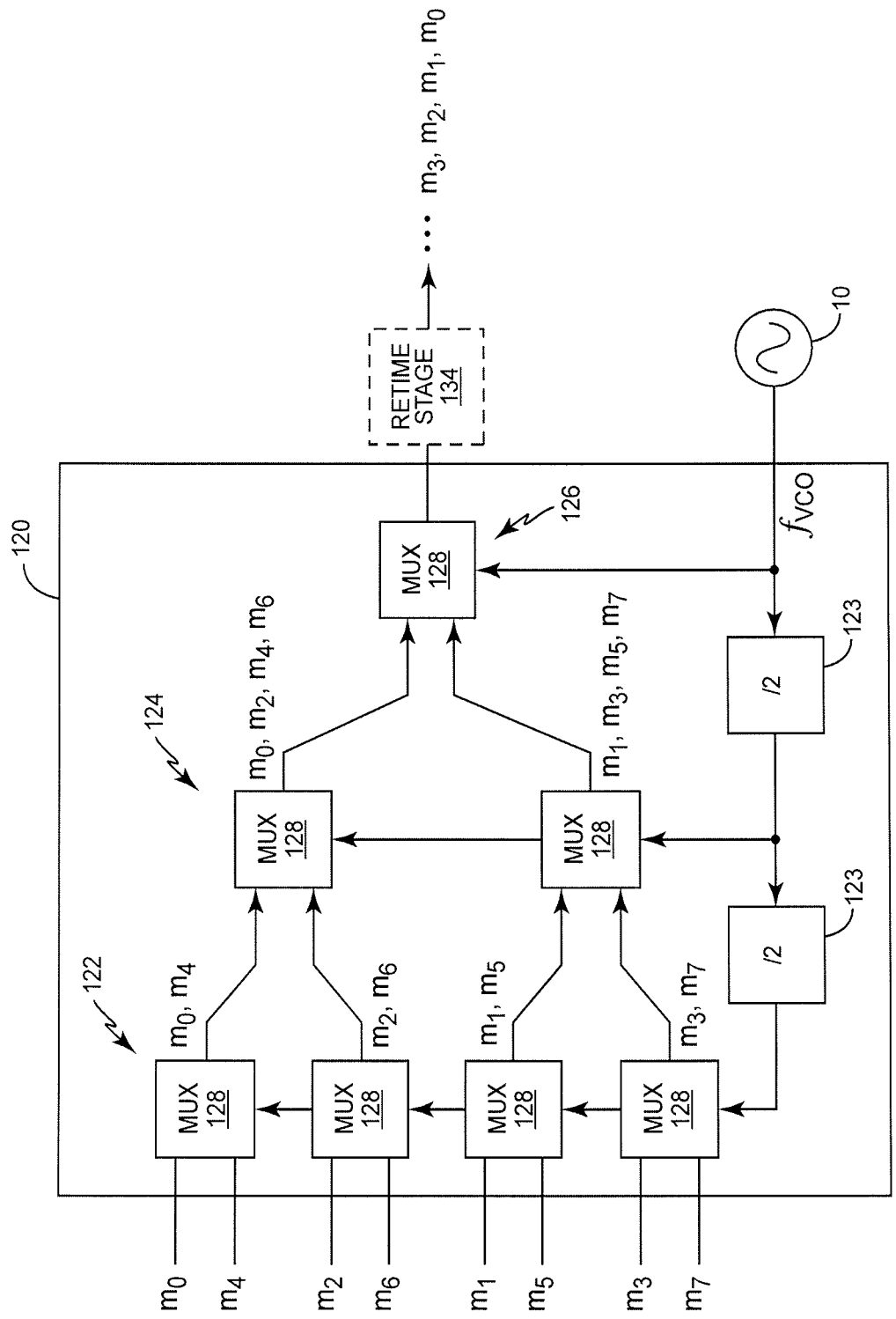
FIG. 4 depicts a block diagram for an exemplary multi-stage multiplexer for the RF divider of FIG. 2.

FIG. 4 depicts one exemplary multi-stage multiplexer 120 comprising multiple stages 122, 124, 126 of 2:1 multiplexing elements 128. In general, each stage reduces the number of outputs and increases the frequency. This enables multiplexer 120 to minimize the number of components operating at high frequencies, e.g., the VCO frequency, while still providing the desired performance. In the example in FIG. 4, each stage halves the number of outputs and doubles the frequency due to the 2:1 structure of the multiplexing elements 128. It will be appreciated, however, that other configurations may be used, e.g., 3:1 or 4:1 multiplexing elements, depending on design preferences. In the example of FIG. 4, multiplexer 120 is a three-stage multiplexer to accommodate the 8-bit sections output by pre-sequencer 110. It will be appreciated, however, that multiplexer 120 may comprise any number of stages, and that the number of stages is dependent on M.

Each stage 122, 124, 126 of multiplexer 120 is clocked at a frequency defined by dividers 123 and $f_{vco}$ to serialize the input bits. To that end, a new M-bit section is input to the first stage 122 every $4/f_{vco}$ clock cycles, and the multiplexing elements 128 in the first stage 122 serialize the pairs of input bits from the M-bit section every $4/f_{vco}$ clock cycles. The multiplexing elements 128 in the second stage 124 serialize the pairs of 2-bit streams output by the first stage 122 every $2/f_{vco}$ clock cycles, and the multiplexing element 128 in the final stage 126 serialize the pairs of 4-bit streams output by the second stage 124 every $1/f_{vco}$ clock cycle to generate the output signal. Because the multiplexer input words comprise sections of the parallel word provided to the input of RF divider 100, and because the parallel word comprises one or more copies of the frequency dividing bit pattern, the signal output by multiplexer 120 comprises a serial bit stream of the parallel word, and therefore comprises a serial bit stream of sequential copies of the frequency dividing bit pattern.

Figure 5:
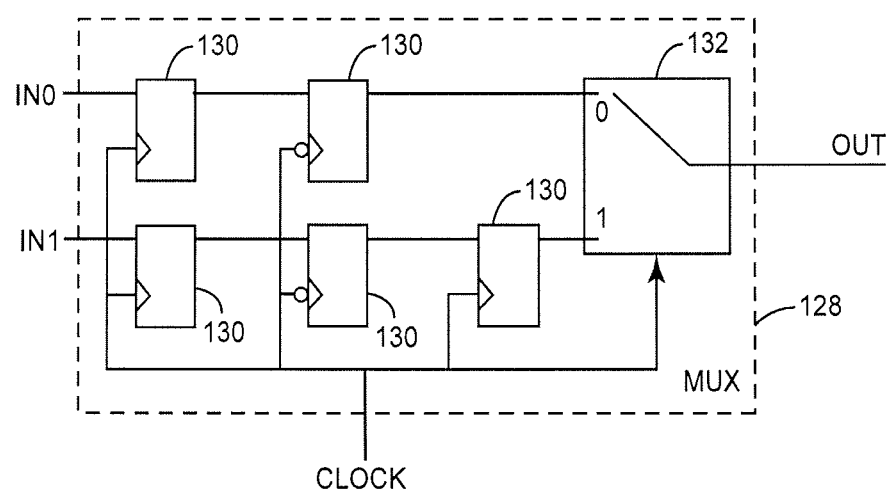
FIG. 5 depicts a circuit diagram for an exemplary multiplexing element for the multi-stage multiplexer of FIG. 4.

Multiplexer 120 may use any known multiplexing element 128, e.g., the multiplexing element 128 depicted in FIG. 5. In this example, multiplexing element 128 comprises five latches 130 and a selector switch 132. The first four latches 130 (serially connected pairs for each of input bits in0 and in1) form flip-flops for retiming purposes, and the remaining latch 130 (for in1) is used to create a half cycle delay relative to the switch input for in0. As a result, each bit output by switch 132 using the clock as a serial bit clock is only available for half of the clock cycle. For example, in the last stage where clock=$f_{vco}$, each bit is only available for half of the VCO cycle.

The multi-stage multiplexer 120 described herein may be followed by an optional retiming stage 134. The retiming stage 134 may be configured to remove spectral impurities introduced by jitter and other imperfections introduced by frequency dividers 123 and multiplexing elements 128. Retiming stage 134 may also or alternatively be configured to retime the output bit stream to satisfy timing/phase requirements. One exemplary retiming stage 134 comprises a high-speed flip-flop, where the flip-flop uses the output of the multi-stage multiplexer 120 as either the clock or the data input.

Figure 6:
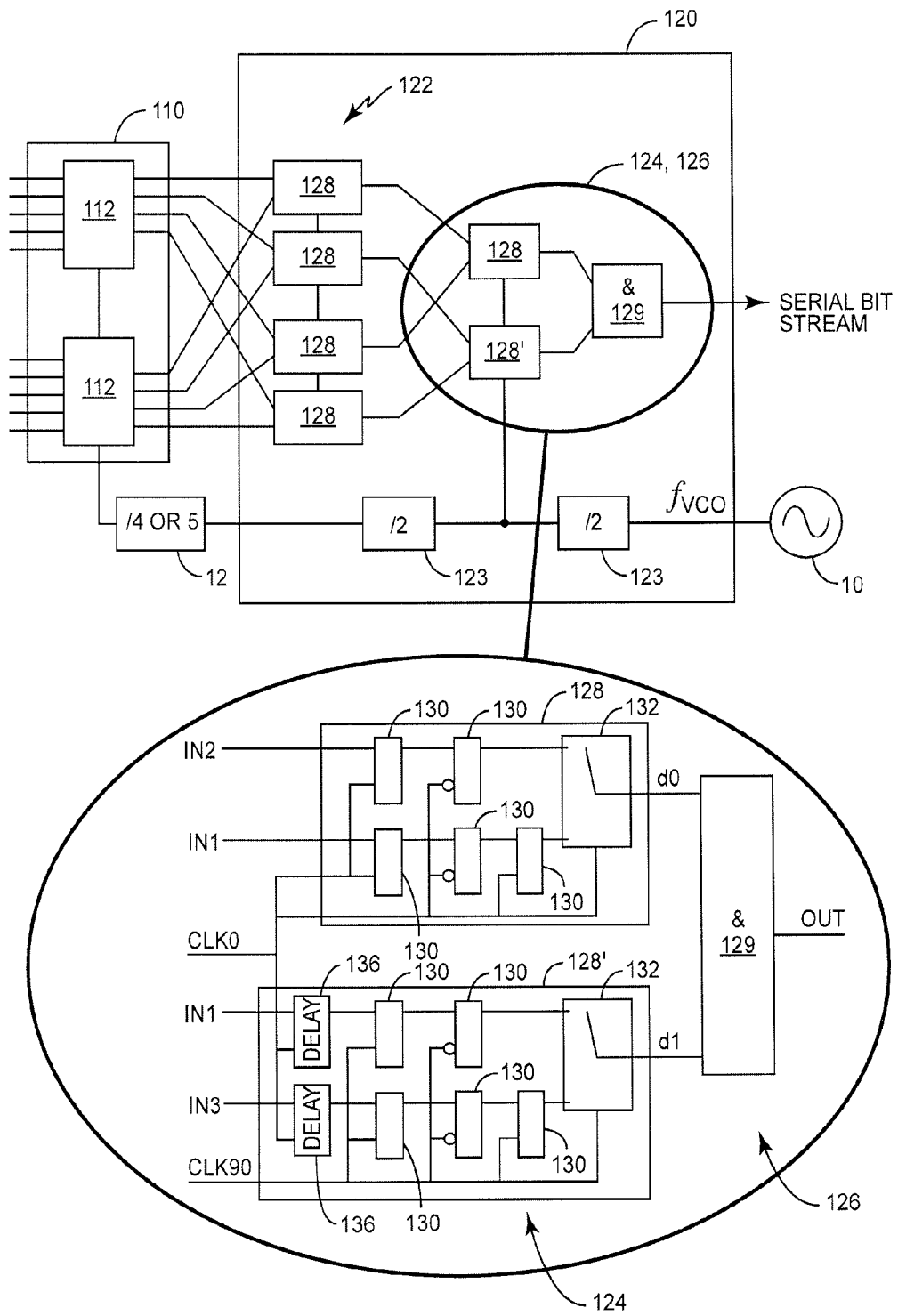
FIG. 6 depicts a block diagram for an alternate multi-stage multiplexer for the RF divider of FIG. 2.
Figure 7:
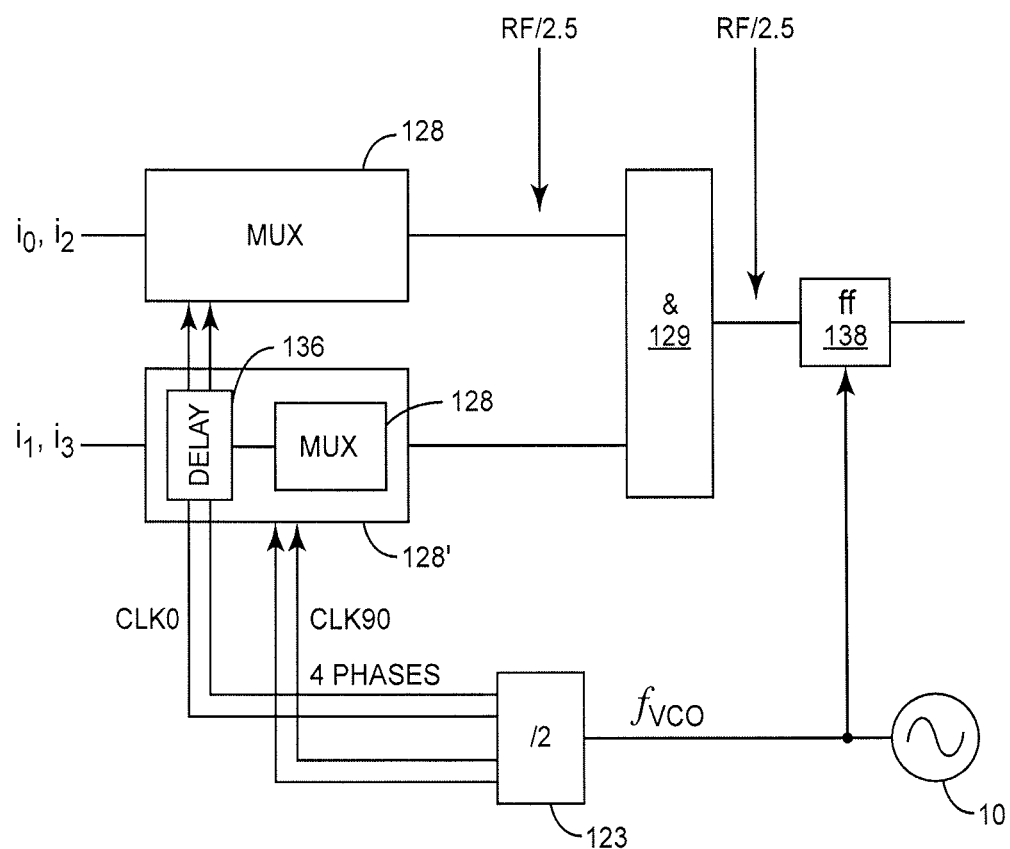
FIG. 7 depicts additional block diagram details for exemplary penultimate and last stages of the multi-stage multiplexer of FIG. 6.
Figure 8:
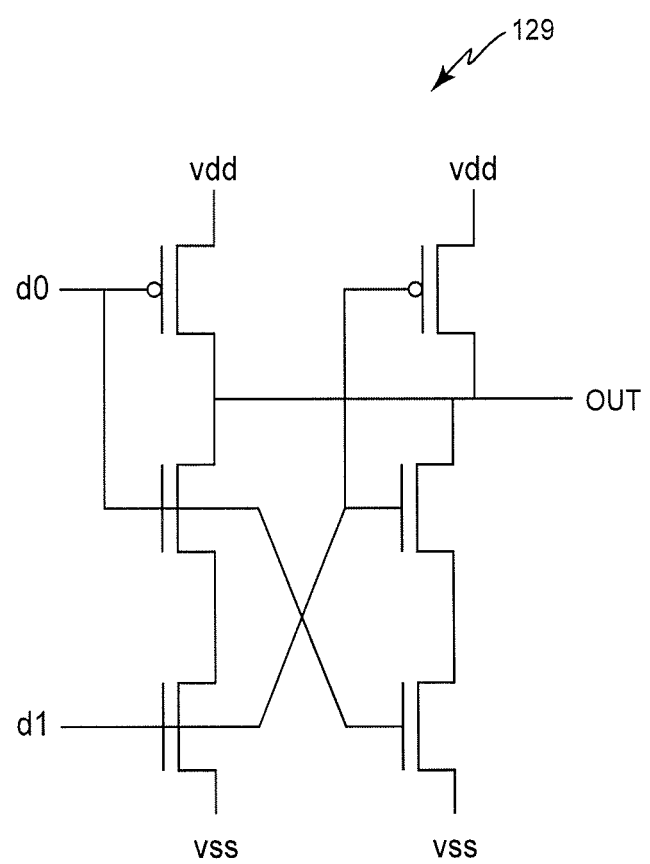
FIG. 8 shows an exemplary NAND circuit to modify the input pattern used by the RF divider of FIG. 1 as modified by the multi-stage multiplexer of FIG. 6.
Figure 9:
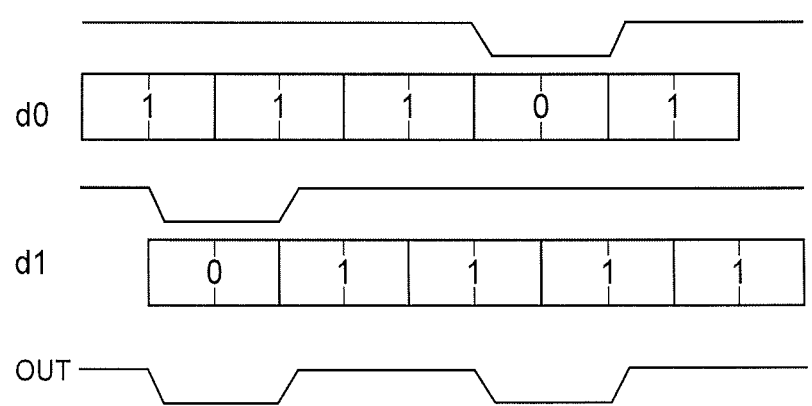
FIG. 9 depicts an exemplary signal timing diagram for the multi-stage multiplexer of FIG. 6.

It will be appreciated that the frequency dividers 123 and the multiplexing elements 128 in multiplexer 120 also add delay that reduces the timing budget of subsequent stages of the RF circuit. FIGS. 6-7 depict another exemplary multiplexer embodiment, where the last two stages 124, 126 of the multiplexer 120 in FIG. 4 are replaced with the stages 124, 126 shown in FIGS. 6-7. In particular, the penultimate stage 124 for this embodiment comprises one multiplexing element 128 as described above, and a modified multiplexing element 128' that adds delay elements 136 to offset the outputs of the multiplexing elements 128, 128', e.g., by half a clock cycle. The last stage 126 replaces the multiplexing element 128 shown in FIG. 4 with a logic gate 129, e.g., an AND or NAND gate, to multiplex the bits output by the penultimate stage 124. FIG. 8 depicts one exemplary logic gate 129 for the embodiment of FIG. 6, where the logic gate 129 preferably presents symmetric loading. Logic gate 129 comprises two NAND gates in parallel, where the inputs for the second NAND are swapped to balance the loading and the delay at the expense of slightly slower transitions. As shown in FIG. 9, combining two inputs offset by half a clock cycle, e.g., in a multiplexing unit 128, 128' in the penultimate stage 124 of the multiplexer 120, generates a divide by 2.5 signal. The advantage of this implementation is the fact that none of the multiplexing elements 128 in the RF divider 100, not even those in last stage of the multiplexer 120, require the full VCO frequency. It is important to balance loading of the divide by 2 element that generates the four phases (extra latch to generate the delay causes an imbalance).

The embodiment of FIGS. 6-7 does not require modification to the pre-sequencer 110. However, the parallel word applied to the pre-sequencer 110 will need to be slightly different. In particular, the modified parallel word applied to the pre-sequencer 110 may be generated from the original parallel word with an OR gate for each individual bit (i) in the word. For example, the bits in a section (S) are modified such that $S_{new}[i]=(S_{old}[i] \text{ OR } S_{old}[i+1])$, as shown in Table 5, where $S_{new}[i]$ represents a bit in the new section S to be applied to the pre-sequencer 110 of FIGS. 6-7, and $S_{old}[i]$, $S_{old}[i+1]$ represent adjacent bits in the old section S that would be applied to the pre-sequencer 110 for the embodiment of FIG. 4.

TABLE 5

| $S_{old}[i]$ | $S_{old}[i+1]$ | $S_{new}[i]$ |
| --- | --- | --- |
| 0 | 0 | 0 |
| 0 | 1 | 1 |
| 1 | 0 | 1 |
| 1 | 1 | 1 |

Applying M-bit sections of the modified parallel word output by the pre-sequencer 110 to the multi-stage multiplexer 120 having the modified penultimate and last stages 124, 126 causes the logic gate 129 of the last stage 126 to output a serial bit stream of the unmodified parallel word.

If the divider used to generate the 4-phase clock is too noisy, the retiming unit 138 may comprise an extra flip-flop that runs directly on the VCO frequency $f_{vco}$, as shown in FIG. 7, to retime the output signal. In the embodiment of FIGS. 6-7, the RF/2.5 is based on the assumption that the frequency dividing bit pattern is 5 bits, and M=10. It will be appreciated, however, that this embodiment is feasible for frequency dividing bit patterns having a length greater than or equal to 3.

Figure 10:
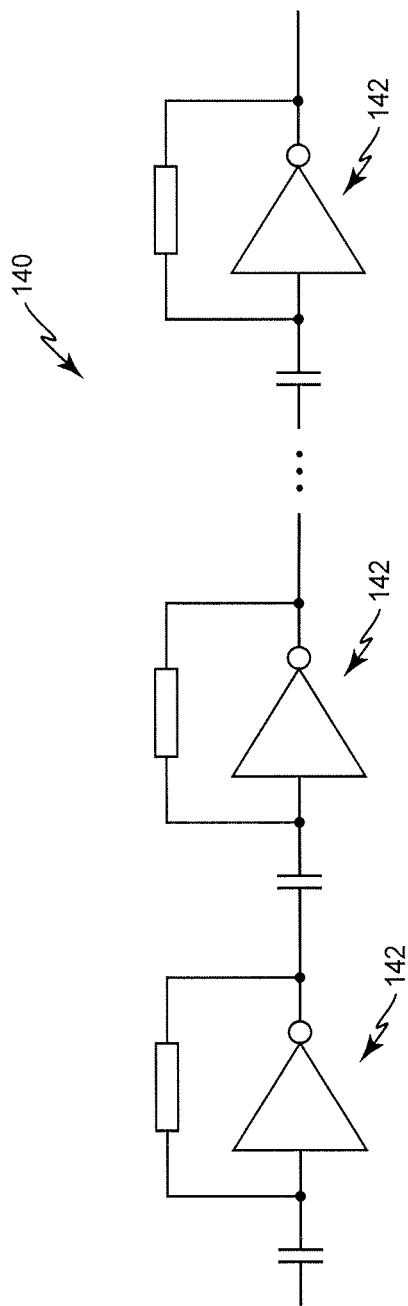
FIG. 10 depicts an exemplary circuit diagram for reducing the second harmonic content at the output of the RF divider of FIG. 1.

The above-described embodiments work best when the parallel words input to the pre-sequencer 110 have a 50% duty cycle. However, as shown in Table 1, some parallel words have an unequal number of 1's and 0's, and therefore, do not have a 50% duty cycle. When the parallel word does not have a 50% duty cycle, the second harmonic content of the serial bit stream output by the RF divider 100 may be undesirably high. To correct this problem, a chain 140 of AC-coupled, self-biased inverters 142, shown in FIG. 10, may be applied to the output of the multiplexer 120. In this case, each inverter stage 142 removes approximately 10 dB from the second harmonic content. Thus, the number of inverter stages 142 may be selected based on a desired performance.

The above-described RF dividers 100 provide several advantages over the prior art, including power efficiency, low phase noise, and programmable phase. For example, CMOS power requirements rise steeply beyond a certain frequency, making it very difficult to realize a function, let alone achieving low power for most radio frequencies used for telecommunications. The RF divider 100 disclosed herein solves this problem at low frequency by using "low quality" dividers 123 that do not have strict phase-noise requirements to provide clocking frequencies for the pre-sequencer 110 and multiplexer 120, and by using a power efficient multi-stage multiplexer 120. Further, retiming the output signal with the VCO signal effectively removes the phase-noise of the previous stages. In addition, because the frequency dividing bit pattern is fully programmable, the absolute phase can be programmed in half VCO cycles. Shifting the frequency dividing bit pattern can provide a means to select the pattern such that interference with other (VCO-derived) frequencies is minimized. A shift can also be used to maximise the timing margin of a circuit that uses the divider output as a clock or data signal.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of dividing a fixed radio frequency by a frequency divisor to generate an output signal having a desired radio frequency, the method comprising:
   successively applying consecutive M-bit sections of a parallel word to an input of a multi-stage multiplexer at a pre-sequencing frequency derived based on the fixed radio frequency and M, said parallel word comprising one or more copies of a frequency dividing bit pattern defining the frequency divisor; and
   performing a parallel-to-serial conversion on the M-bit sections of the parallel word in the multi-stage multiplexer based on the fixed radio frequency to generate the output signal having the desired radio frequency, said output signal comprising a serial bit stream of the parallel word.

2. The method of claim 1 wherein performing the parallel-to-serial conversion comprises successively multiplexing groups of bits in the M-bit sections in multiple stages of the multi-stage multiplexer, wherein each stage has a smaller width and a higher frequency than the previous stage, and wherein the last stage of the multi-stage multiplexer outputs the serial bit stream using the fixed radio frequency as a serial bit clock according to the frequency dividing bit pattern to generate the output signal having the desired radio frequency.

3. The method of claim 1 wherein performing the parallel-to-serial conversion comprises successively multiplexing pairs of bits in the M-bit sections in multiple stages of the multi-stage multiplexer, wherein each stage has a smaller width and a higher frequency than the previous stage, wherein the penultimate stage of the multi-stage multiplexer is clocked at half the fixed radio frequency, and wherein the last stage of the multi-stage multiplexer combines the bit streams output by the penultimate stage in a logic gate to generate the output signal having the desired radio frequency.

4. The method of claim 3 further comprising modifying the parallel word with a logic function to generate a modified parallel word, wherein successively applying consecutive M-bit sections of the parallel word comprises successively applying consecutive M-bit sections of the modified parallel word to the input of the multi-stage multiplexer such that the serial bit stream output by the logic gate in the last stage of the multi-stage multiplexer comprises a serial bit stream of the unmodified parallel word.

5. The method of claim 1 wherein the frequency dividing bit pattern comprises P bits and each parallel word comprises N bits, where P≦N, the method further comprising forming the M-bit sections by concatenating M consecutive bits of the N-bit parallel word to form each of the one or more M-bit sections, wherein the concatenated bits wrap around from the end of the N-bit parallel word to the beginning of the N-bit parallel word such that the N-bit parallel word is repeated y times to form x M-bit sections, where x=N/z and y=M/z, and where z=greatest common denominator (N,M).

6. The method of claim 1 wherein the frequency dividing bit pattern comprises P bits, and wherein the frequency divisor is P/2.

7. The method of claim 1 further comprising reducing a second harmonic content of the output signal when the number of 1's in the frequency dividing bit pattern does not equal the number of 0's in the frequency dividing bit pattern.

8. The method of claim 1 wherein the frequency divisor is greater than one, such that the desired radio frequency is less than the fixed radio frequency.

9. The method of claim 1 wherein the divisor is a non-integer.

10. The method of claim 1 wherein the frequency divisor equals one such that the desired radio frequency equals the fixed radio frequency.

11. The method of claim 1 further comprising retiming the output signal to satisfy one or more timing requirements.

12. A radio frequency divider to divide a fixed radio frequency by a frequency divisor to generate an output signal having a desired radio frequency, the radio frequency divider comprising:
   a pre-sequencer configured to successively output consecutive M-bit sections of a parallel word at a pre-sequencing frequency derived based on the fixed radio frequency and M, said parallel word comprising one or more copies of a frequency dividing bit pattern defining the frequency divisor; and
   a parallel-to-serial converter operatively coupled to an output of the pre-sequencer and configured to perform a parallel-to-serial conversion on the M-bit sections of the parallel word based on the fixed radio frequency to generate the output signal having the desired radio frequency, said output signal comprising a serial bit stream of the parallel word.

13. The radio frequency divider of claim 12 wherein a processor coupled to an input of the radio frequency divider is configured to define the parallel word based on the fixed radio frequency and the desired radio frequency.

14. The radio frequency divider of claim 12 wherein the parallel-to-serial converter comprises a multi-stage multiplexer configured to perform the parallel-to-serial conversion by successively multiplexing groups of bits in the M-bit sections applied to an input of the multi-stage multiplexer based on the fixed radio frequency, wherein each stage of the multi-stage multiplexer has a smaller width and a higher frequency than the previous stage, and wherein the last stage of the multi-stage multiplexer outputs the serial bit stream using the fixed radio frequency as a serial bit clock according to the frequency dividing bit pattern to generate the output signal having the desired radio frequency.

15. The radio frequency divider of claim 12 wherein the parallel-to-serial converter comprises a multi-stage multiplexer configured to perform the parallel-to-serial conversion by successively multiplexing pairs of bits in the M-bit sections applied to an input of the multi-stage multiplexer based on the fixed radio frequency, wherein each stage of the multi-stage multiplexer has a smaller width and a higher frequency than the previous stage, wherein the penultimate stage of the multi-stage multiplexer is clocked at half the fixed radio frequency, and wherein the last stage of the multi-stage multiplexer comprises a logic gate to combine the bit streams output by the penultimate stage to generate the output signal having the desired radio frequency.

16. The radio frequency divider of claim 15 wherein a logic function applied to the parallel word generates a modified parallel word, wherein the pre-sequencer is configured to successively output consecutive M-bit sections of the modified parallel word such that the serial bit stream output by the logic gate in the last stage of the multi-stage multiplexer comprises the a serial bit stream of the unmodified parallel word.

17. The radio frequency divider of claim 12 wherein the frequency dividing bit pattern comprises P bits and each parallel word comprises N bits, where $P \leq N$, wherein the pre-sequencer forms the M-bit sections by concatenating M consecutive bits of the N-bit parallel word to form each of the one or more M-bit sections, and wherein the concatenated bits wrap around from the end of the N-bit parallel word to the beginning of the N-bit parallel word such that the N-bit parallel word is repeated y times to form x M-bit sections, where $x=N/z$ and $y=M/z$, and where z=greatest common denominator $(N,M)$.

18. The radio frequency divider of claim 12 further comprising a chain of AC-coupled inverters configured to reduce a second harmonic content of the output signal when the number of 1's in the frequency dividing bit pattern does not equal the number of 0's in the frequency dividing bit pattern.

19. The radio frequency divider of claim 12 wherein the divisor is a non-integer.

20. The radio frequency divider of claim 12 further comprising a retiming stage operatively connected to an output of the logic gate and configured to retime the output signal to satisfy one or more timing requirements.

* * * * *